United States Patent
Ohlhoff et al.

(10) Patent No.: US 7,231,562 B2
(45) Date of Patent: Jun. 12, 2007

(54) MEMORY MODULE, TEST SYSTEM AND METHOD FOR TESTING ONE OR A PLURALITY OF MEMORY MODULES

(75) Inventors: Carsten Ohlhoff, Dresden (DE); Peter Beer, Fontainbleau (FR)

(73) Assignee: Infineon Technologies AG, Munich (DE)

( * ) Notice: Subject to any disclaimer, the term of this patent is extended or adjusted under 35 U.S.C. 154(b) by 310 days.

(21) Appl. No.: 10/754,455

(22) Filed: Jan. 9, 2004

(65) Prior Publication Data

US 2004/0260987 A1 Dec. 23, 2004

(30) Foreign Application Priority Data

Jan. 11, 2003 (DE) ................. 103 00 781

(51) Int. Cl.
*G01R 31/28* (2006.01)
(52) U.S. Cl. .............. 714/718; 714/733; 714/734; 714/30; 724/755
(58) Field of Classification Search .............. None
See application file for complete search history.

(56) References Cited

U.S. PATENT DOCUMENTS

| | | | | |
|---|---|---|---|---|
| 5,638,383 | A * | 6/1997 | Wotzak et al. | 714/733 |
| 6,505,313 | B1 * | 1/2003 | Phan et al. | 714/718 |
| 6,574,763 | B1 * | 6/2003 | Bertin et al. | 714/738 |
| 6,643,807 | B1 * | 11/2003 | Heaslip et al. | 714/719 |
| 6,651,202 | B1 * | 11/2003 | Phan | 714/733 |
| 6,668,348 | B1 * | 12/2003 | Nakamura | 714/733 |
| 6,721,215 | B2 * | 4/2004 | Le et al. | 365/200 |
| 6,769,081 | B1 * | 7/2004 | Parulkar | 714/733 |
| 6,871,297 | B2 * | 3/2005 | Puri et al. | 714/30 |
| 6,907,555 | B1 * | 6/2005 | Nomura et al. | 714/719 |
| 7,047,465 | B1 * | 5/2006 | Trimberger | 714/725 |
| 2001/0054166 | A1 * | 12/2001 | Fukuda | 714/733 |
| 2004/0006729 | A1 * | 1/2004 | Pendurkar | 714/733 |

FOREIGN PATENT DOCUMENTS

WO WO 02/25957 A2 3/2002

OTHER PUBLICATIONS

F. Karimi & F. Lombardi, "A Scan-Bist Environment for Testing Embedded Memories", IEEE Computer Cosiety, 1087-4852/02, all pages (no page numbers thus entire document, 7 pages in all).*
Bai Hong Fang and Nicola Nicolici, "Power-Constrained Embedded Memory BIST Architecture", IEEE Computer Cosiety, 1063-6722/03, all pages (no page numbers thus entire document, 8 pages in all).*
Examination Report dated Mar. 29, 2004.
English Translation of Examination Report dated Mar. 29, 2004.

* cited by examiner

*Primary Examiner*—Albert Decady
*Assistant Examiner*—Steven D. Radosevich
(74) *Attorney, Agent, or Firm*—Patterson & Sheridan, L.L.P.

(57) ABSTRACT

The invention relates to an integrated memory module having a memory unit and a self-test circuit, the self-test circuit being embodied in such a way as to make available test data and test addresses for testing memory areas in the memory unit and to generate defect data depending on the detection of a defect, a test circuit being provided in order to receive defect data from one or a plurality of connectable memory modules to be detected, the test circuit being configured in such a way as to store the received defect data depending on addresses assigned thereto in the memory unit.

21 Claims, 1 Drawing Sheet

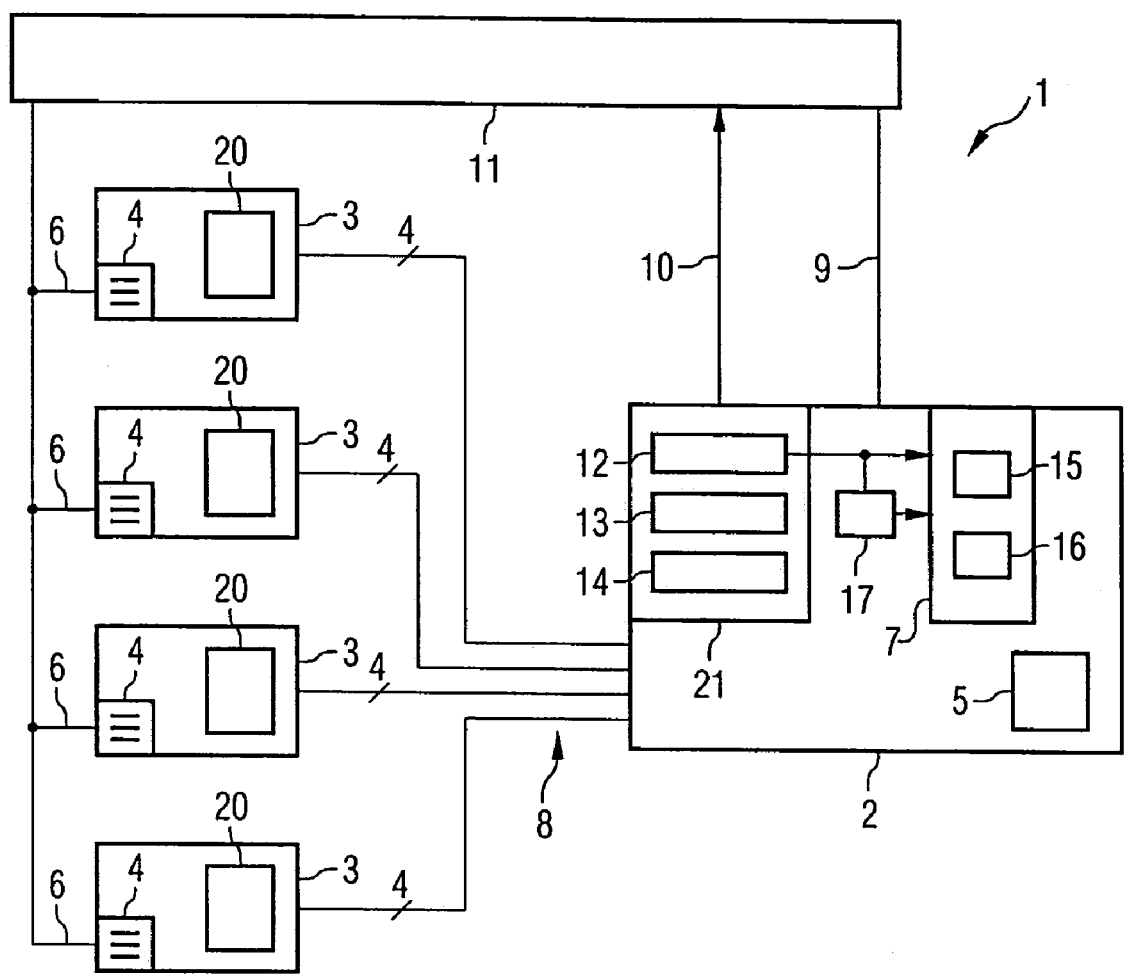

MEMORY MODULE, TEST SYSTEM AND METHOD FOR TESTING ONE OR A PLURALITY OF MEMORY MODULES

CROSS-REFERENCE TO RELATED APPLICATIONS

This application claims foreign priority benefits under 35 U.S.C. §119 to co-pending German patent application number 103 00 781.4, filed Jan. 11, 2003. This related patent application is herein incorporated by reference in its entirety.

BACKGROUND OF THE INVENTION

1. Field of the Invention

The invention relates to an integrated memory module having a self-test circuit, to a test system and also to a method for testing integrated memory modules.

2. Description of the Related Art

In order to check integrated memory modules with regard to their functionality after the production process, they are tested. For this purpose, the integrated memory modules are connected to a tester device and a test operation is started, during which each of the memory cells of the integrated memory module is checked with regard to predetermined specifications.

The memory module is tested by data being written in and subsequently read out again, defect data being generated from a comparison between data written in and data stored in the relevant memory cell, which defect data specify whether the memory cell is defective or functions correctly. The generation of the data for testing the memory module can be effected by a self-test circuit which also determines the defect data.

Said defect data have to be transferred from each of the memory modules to be tested to the testing test device. This is time-consuming and considerably restricts the throughput of integrated memory modules.

The defect data determined serve to determine a repair solution which makes it possible to replace defective memory areas in the integrated memory module by redundantly provided memory areas which are likewise present in the integrated memory module. However, since a defective memory cell is not replaced by a redundant memory cell, but rather by a redundant memory area, it suffices, for the determination of the repair solution, to obtain only a defect address of the memory area in which one or a plurality of defective memory cells are situated. This may be done for example as early as in the self-test circuit provided in the integrated memory module, so that the defect data to be transferred to the tester device are already compressed. Since no information required for determining the repair solution is lost as a result, the term redundancy-conforming compression is used.

Despite compression, the time taken to transfer the defect data is considerable and the throughput when testing integrated memory modules on a tester device is thus restricted.

SUMMARY OF THE INVENTION

It is an object of the present invention to provide an integrated memory module, a test system and a method for testing memory modules by means of which the time for testing memory modules can be reduced and the throughput can thus be increased.

A first aspect of the present invention provides an integrated memory module having a memory unit and a self-test circuit. The self-test circuit is embodied in such a way as to make available test data and test addresses for testing memory areas in the memory unit and to generate defect data depending on the detection of a defect. Furthermore, a test circuit is provided in order to receive defect data from one or a plurality of connectable memory modules to be tested and in order to store the received defect data depending on addresses assigned thereto in the memory unit.

Preferably, it may also be provided that, in the case of a plurality of connected memory modules to be tested, the test circuit stores the received defect data of each of the memory modules to be tested in a corresponding memory area—assigned to the respective memory module to be tested in the memory unit.

In this way, a memory module can be produced which makes it possible to test other memory modules, even ones of the same type. Whereas it has been customary hitherto to start the self-test operation by means of a tester device and to transfer the defect data determined to the tester device, the defect data determined are now transmitted to a further memory module which, according to the invention, is equipped with a test circuit. In this way, it is possible that memory modules can reciprocally test one another without a tester device connected thereto having to intervene in the test operation. The test circuit which has to be provided for this purpose in the integrated memory modules enables the reception of defect data from other connected memory modules and stores the defect data in the memory unit in such a way that an assignment to the respective memory modules to be tested and to the memory areas in the memory modules to be tested is possible.

It may be provided that the self-test circuit generates the addresses for storing the defect data. In this way, addresses at which the received defect data are stored can be provided in the testing memory module. In this way, it is possible, on the one hand, to avoid having to transfer, with respect to the defect data, also the addresses thereof from the tested memory modules. On the other hand, it is possible to dispense with the provision of an additional address generator circuit since the self-test circuit is already designed for the generation of address values for the self-test operation.

A data compression unit may be provided in order to compress the received defect data in a redundancy-conforming manner prior to storage in the memory element. In this way, it is possible to save memory space in the testing memory module, with the result that a larger number of memory modules connected thereto can be tested.

As an alternative, it may be provided that the test circuit is configured in such a way as to receive defect data compressed in a redundancy-conforming manner and to store them in a manner assigned to the respective addresses of the memory areas. For this purpose, an address assignment unit is preferably provided in order to generate, from the test addresses generated by the self-test circuit, memory addresses for storing the defect data compressed in a redundancy-conforming manner. The memory addresses are assigned to the memory areas in the memory modules to be tested in such a way that each of the defect data compressed in a redundancy-conforming manner can be assigned to a corresponding memory area in the memory module to be tested. In this way, it is possible to use the self-test circuit for generating the addresses to which the defect data of the tested memory modules are to be written. The address assignment unit has the function, in the case of defect data compressed in a redundancy-conforming manner, of making the addresses available in such a way that as little memory space as possible or no memory space is wasted in the memory unit.

Preferably, the address assignment unit has a shift register in order to divide an address value of the test address in accordance with a compression factor of the defect data compressed in a redundancy-conforming manner. This is expedient in particular because the self-test circuits in the memory modules to be tested and also in the testing memory module are started simultaneously, so that the address counters in each case provide the same address value. However, since successive address values correspond to a single memory area in the case of defect data compressed in a redundancy-conforming manner, only a single-defect datum determined applies to the successive address values, said defect datum being assigned to the memory area which is formed by the successive address values. Through the shift register, the address values can be divided in such a way that successive address values are in each case assigned to a memory area.

It may be provided that the defect data stored in the memory unit are read out by a read-out unit, e.g., in the tester device.

Furthermore, it may be provided that the memory module can be operated in a first test mode, depending on a received first command signal, with the aid of a command decoding unit. In the first test mode, the self-test circuit tests the memory unit and outputs defect data which are dependent on a detected defect. In the first test mode, the customary self-test operation is therefore carried out by the self-test circuit of the integrated memory module.

It may furthermore be provided that the command decoding unit is configured in such a way as to operate the memory module in a second test mode, depending on a received second command signal. In the second test mode, the test circuit receives defect data from a connected memory module to be tested and stores the defect data in the respectively assigned memory area of the memory unit.

A further aspect of the present invention provides a test system having the integrated memory module according to the invention. The first testing memory module is connected to second memory modules to be tested, it being possible, after the end of a test operation, for the defect data stored in the first integrated memory module to be read out into an external defect data evaluation unit. The defect data evaluation unit serves to calculate the repair solution from the defect data determined and is usually situated in a conventional tester device.

It may preferably be provided that the defect data evaluation unit starts the test operation in the second memory modules and the storage of the defect data in the first memory module in each case by means of a test start command.

It may preferably be provided that a plurality of first memory modules are in each case connected to the second memory modules. The second memory modules can be tested successively in a plurality of test steps with in each case one of the first memory modules. During the testing with one of the first memory modules, defect data of a preceding test step are read out to the defect data evaluation unit. As a result, it is possible to nest the operations of the testing of the second memory modules in test steps of a test operation and of the read-out of the defect data to the defect data evaluation unit.

A further aspect of the present invention provides a method for testing memory modules. The testing is carried out with the aid of a first memory module, to which one or a plurality of second memory modules are connected. After the reception of a test start command by the second memory modules, a self-test operation is started in the second memory modules. The self-test operation determines defect data in the second memory modules, the defect data depending on a detected defect. The defect data determined are transferred to the first memory module, which tests the second memory modules. The defect data are stored there in such a way that they are assigned to the corresponding second memory modules and the corresponding memory areas in the second memory modules. After the conclusion of the self-test operation, the defect data stored in the first memory module are transferred in order to determine a repair solution.

The method according to the invention has the advantage that the self-test operation, after the start, can be carried out independently of a connected tester device since the defect data are stored in the first memory module. The first memory module thus forms that part of a tester device which receives the defect data and stores them in a defect data memory. As a result, it is possible to relieve the burden on the tester device in that defect data are transferred to the tester device only once, namely after the conclusion of the self-test operation. Since the self-test operation usually comprises a plurality of address passes in which defect data are respectively made available, the first memory module thus serves to receive the defect data, to store and to collect them in a suitable manner and to transfer them to the tester device or the defect data evaluation unit of the tester device only after the conclusion of the self-test operation. Consequently, the quantity of data to be transferred to the tester device can be considerably reduced, with the result that a larger number of memory modules can be tested simultaneously.

In order to increase the quantity of second memory modules to be tested simultaneously, the defect data can be compressed in a redundancy-conforming manner either prior to transfer to the first memory module or in the second memory module.

BRIEF DESCRIPTION OF THE DRAWINGS

A preferred embodiment of the invention is explained in more detail below with reference to the accompanying FIGURE showing a test system.

DETAILED DESCRIPTION OF THE PREFERRED EMBODIMENT

The single FIGURE shows a test system 1 according to the invention having an integrated first memory module 2 according to the invention and second memory modules 3 connected thereto. The second memory modules 3 may be both conventional memory modules to be tested and memory modules to be tested which are structurally identical to the first memory module 2. What is essential for the second memory modules 3 is that they each have a second self-test unit 4. The first memory module 2 has a first memory unit 5 and the second memory modules 3 have second memory units 20.

The self-test unit 4 serves to start a self-test in accordance with a corresponding test start command, the memory cells (not shown) of a memory unit 20 in the respective second memory module 3 in each case being tested during the self-test. Defect data which specify whether a memory cell is defective or functions without any defects are generated during the self-test.

The test start command is received by the self-test unit 4 via a command line 6. The self-test unit 4 then generates test addresses and test data which are written to the respective second memory cells of the respective second memory unit 20 and are subsequently read out. The defect data are a result of comparing the written-in data with the data stored in the memory cells of the respective memory unit.

The defect data thus determined have to be evaluated during the testing of the second memory modules 3, a repair solution being determined which specifies whether and in what way the defective memory cells are to be replaced by redundant memory areas likewise provided in the second memory modules 3.

For this purpose, the defect data are usually transferred from the second memory modules 3 to be tested to a tester device, in which firstly the storage of the defect data is performed and then the stored defect data are processed further in such a way that a repair solution is determined. The self-tester unit 4 carries out test passes on multiple occurrences, i.e., there are multiple occurrences of the entire address range of the respective second memory unit 20 being passed through and data being written in and subsequently read out again. Since defect data are determined each time in this case, these defect data, in test systems according to the prior art, have to be transferred to the tester device, where they are stored in a suitable manner in a defect-address memory provided there. The transfer of defect data after each address pass has the effect that a long time duration is required in order to transfer the defect data to the tester device.

In order to minimize this time, compression methods are provided, which are usually present in the self-test unit 4. Since not every defective memory cell is replaced by a redundantly provided intact memory cell, rather entire memory areas with a plurality of memory cells are exchanged, it suffices, for the determination of the suitable repair solution, to transfer only defect data about intact and defective memory areas, i.e., memory areas containing no defective memory, or one or more defective memory cells. Although this leads to a reduction of the defect data, the time taken to transfer the already compressed defect data is still considerable.

According to the invention, it is now provided that the second memory modules 3 to be tested are connected to a first memory module 2, which has a first self-test unit 21, which is of the same type as the second memory modules 3, and the first memory unit 5. The first memory module 2 is connected to the second memory module/modules 3 to be tested in such a way that the data outputs of the second memory modules 3 are connected to data inputs of the first memory module 2. Defect data which are transmitted via the data outputs of the second memory modules 3 can thus be received by the first memory module 2 via the data inputs. In this way, the defect data stored in the first memory unit 5 are to be made available to the first memory module 2. The number of connectable second memory modules 3 to be tested depends on the width of the defect data respectively output by the second memory modules 3 and on the number of data inputs of the first memory module 2.

Furthermore, the number of connectable second memory modules 3 to be tested depends on the size of the first memory unit 5 in the first memory module 2. Thus, in the case of an identical size of the first and second memory units 5, 20 of the first memory module 2 and of the second memory module 3, only one second memory module 3 can be tested with the aid of the first memory module 2. If the defect data are compressed, e.g., by the factor 4, then it is possible to connect four second memory modules 3 to the first memory module 2 and defect data can be transferred jointly to the first memory module 2. The first memory unit 5 of the first memory module 2 then has a sufficient storage capacity in order to store the defect data from the second memory modules 3.

It goes without saying that it is possible for the first memory unit 5 of the first memory module 2 to have a different storage capacity than the storage capacities of the second memory units 20 of the second memory modules 3. Thus, by way of example, a first memory module 2 having a lower or higher storage capacity may be provided. In particular, the first memory module 2 provided may be a memory module having a memory unit 5 of an older generation having a lower storage capacity, in order to test memory modules 3 of a newer generation having an increased storage capacity. In particular, the compression factor with which the defect data are compressed is important in this case.

The defect data in the memory modules 3 to be tested are preferably compressed, with the result that a smaller number of data transfer lines to the first memory module 2 are required. Compression circuits which compress the defect data in a redundancy-conforming manner are usually provided for this purpose in the self-test units 4.

The defect data received from the first memory modules 3 to be tested have to be stored in the first memory unit 5 of the first memory module 2 in such a way that there is an exact assignment to the defective memory cell or to the defective memory area (in the case of compressed defect data) and an exact assignment to the respective connected memory modules 3 to be tested. A test circuit 7 having an address assignment unit 15 is provided for this purpose. The address assignment unit 15 accepts the defect data from the defect data lines 8 connected to the data inputs of the first memory module 2 and stores them in the memory unit 5 of the first memory module 2 in such a way that each address of the memory unit 5 is unambiguously assigned to a connected memory module 3 to be tested and to the respective memory areas of the corresponding memory units 20 of the second memory modules 3.

Furthermore, the test circuit 7 undertakes the task of ORing the defect data from each of the second memory modules 3 with the defect data already determined during two preceding address passes. For this purpose, the previously determined detect data of the relevant second memory module 3 are read from the memory unit 5 of the first memory module 2, ORed with the newly received defect data from the relevant second memory module 3 and subsequently written again to the address ranges of the first memory unit 5 of the first memory module 2 which are assigned to the respective relevant second memory module 3. The clock frequency for transferring the defect data to the first memory module 2 is made available by the tester device 11 and is adapted such that this operation of ORing the defect data can be carried out. What is avoided in this way is that soft errors which are detected only during some or only during one of the address passes during the self-test operation are not overwritten by subsequent defect data in which a defective memory area detected previously has not been detected as defective.

It may also be provided that, instead of the defect data being ORed with the defect data already received, only those defect data with which a defect has been ascertained in a memory area of the second memory unit 20 are selectively written to the first memory unit 5. This enables a higher clock frequency for testing, since the defect data can be stored more rapidly in the first memory unit 5.

The self-test operation proceeds essentially in parallel for all the second memory modules 3 and therefore essentially ends simultaneously. After the end of the self-test operation, the defect data are stored in the first memory module 2. The stored defect data are then transferred to a test device 11 via defect data lines 10. The test device 11 may also be connected to the data lines 10 in a switchable manner in order to receive the defect data.

The tester device 11 controls the test sequence by applying the test start command for the second memory modules 3 on the first command line 6 and simultaneously transmitting a defect data reception command to the first memory module 2 via a second command line 9. The defect data reception command has the effect in the first memory module 2 that defect data can be received from the second memory modules 3 and these are stored in a manner assigned to the respective second memory modules 3 tested and in a manner assigned to the respective memory areas in the memory unit 5 of the first memory module 2.

The tester device 11 furthermore generates a clock signal which prescribes the clock frequency for testing the second memory modules 3. After the test start command and after the defect data reception command, the first and the second memory modules 2, 3 receive the common clock, with the result that the first and the second memory modules 2, 3 are operated synchronously. Consequently, after the test start command and the defect data reception command have been received, the test address which specifies the currently tested memory area is known in the first and the second memory modules 2, 3.

Since only the respective defect data, but not the addresses thereof, are transmitted from the second memory modules, 3 it is necessary, in order to be able to carry out an assignment of the defect data to the respective memory areas, that the first memory module 2 contains the information as to the memory area with which the respectively received defect datum is associated.

The first and second self-test circuits 4, 21 have an address generator 12, a test data generator 13 and a command decoder 14. The address generator 12 is started with the reception of the test start command via the first command lines 6, and usually generates successive addresses beginning with a start address in accordance with the clock signal. For this purpose, the test data generator 13 generates test data, usually exclusively zeros or ones or simple test pattern data.

In order to save chip area in the first memory module 2, the address generator 12 of the first self-test unit 21 may likewise be used, in a test mode, to make available the addresses for storing the defect data in the first memory unit 5 of the first memory module. In order that the address generators 12 of the self-test units 4, 21 of the first and of the second memory modules 2, 3 run synchronously with one another, the tester device 11 must transmit the test start command and the defect data reception command essentially simultaneously to the first and second memory modules 2, 3 in such a way that the respective address generators 12 simultaneously begin to count up the address values. During the generation of test addresses, it is usually provided that the address jumps amount to only one in each case. It goes without saying that it may also be provided that the address jumps may assume other values.

The defect data may be compressed in a redundancy-conforming manner before or after the transfer to the first memory module. If the defect data are compressed after the transfer to the first memory module, a data compression unit 16 is provided in the test circuit 7 in order to carry out the compression of the defect data.

If the defect data are transmitted to the first memory module 2 in compressed fashion, then the respective defect data are identical for successive address values. In order to prevent the storage of identical defect data in the first memory unit 5 of the first memory module 2, it is necessary for the counting up of the address likewise to be slowed down by the compression factor.

By way of example, if the defect data in one of the memory modules 3 to be tested are compressed by a factor of 4, then this means that, in the case of 4 tested memory cells of a memory area, only one defect datum having a size of 1 bit is supplied to the first memory module 2. This one defect datum bit is available after the addressing of 4 memory cells with the aid of addresses which are generated by the address generator 12 of the second self-test unit. In order that the same value of the defect datum is not written to the first memory unit 5 of the first memory module 2, to the corresponding four addresses, it is expedient for the counting up of the address values to be slowed down by means of shift register 17 in such a way that the defect data for different memory areas in the memory module 3 to be tested are stored at successive addresses of the first memory unit 5.

In the case of a compression factor of 4, it is expedient, therefore, for the address value generated by the address generator 12 to be divided by the factor 4, i.e., for the address bits generated by the first self-test unit 21 to be shifted toward the right by two bits. In this way, the four defect data bits which are generated after the parallel testing of 4 memory cells, i.e., 4 address values, in the second memory modules 3 to be tested can be stored in an address of the first memory unit 5 of the first memory module 2.

The quantity of data to be transferred to the test device is considerably reduced by the test system according to the invention and the method for testing the memory modules to be tested. The tester device 11 only has to output the test start command and the defect data reception command to the first and second memory modules 2, 3, whereby the self-test operation is started in the second memory modules 3 and the consequently received defect data are stored by the first memory module 2. Further assistance by the tester device 11 is not necessary for this purpose.

Depending on the number of free interfaces, the tester device 11 can drive a plurality of such test arrangements comprising first and second memory modules 2, 3, these test arrangements preferably being driven in a temporally staggered manner with respect to one another in such a way that overlaps do not occur during the read-out of the stored defect data determined from the first memory modules 2.

The test arrangements which are connected to the tester device 11 may also comprise more than one first testing memory module 2, which are in each case connected to all the second memory modules contained in the respective test arrangement. This is expedient if the second memory modules 3 are to be successively tested in a plurality of test steps. In this case, one of the plurality of first memory modules 2, preferably one of two first modules 2, undertakes the operation of the testing of the second memory modules 3 and the storage of the defect data in the first memory unit 5 and a respective other first memory module 2 transfers the defect data stored in the preceding test step in the first memory unit 5 of the other first memory module 2 to the tester device 11, preferably via defect data lines 10. This may essentially be effected simultaneously, with the result that the test operation can be accelerated by the nesting of testing and read-out of the defect data. In order to control this operation, the tester device 11 makes the test start command and defect data reception command available to the first memory modules 2 alternately.

The transfer of the defect data from the first memory unit 5 of the first memory module 2 to the test device 11 is usually effected serially, the parallelism depending on the number of available data inputs at the test device 11. The parallelism of the defect data lines 10 is preferably chosen in such a way that the number of connected test systems comprising first and second memory modules 2, 3, the time duration for the self-test operation and the time duration—dependent on the parallelism of the defect data lines 10—for the read-out of the defect data to the first memory module produce an optimum for which the throughput of tested second memory modules 3 is the highest. This is the case in particular when, during the read-out of data from one of the first memory modules 2 of the various test systems, as far as possible the self-test operations of the remaining test systems, in accordance with the method described, are still under way.

The invention provides for the integrated memory modules to be equipped with the test circuit 7 as standard, so that the relevant memory-modules 2, 3 can reciprocally test one another. If the second memory modules 3 are being tested, the test circuit 7 remains inactive; only the self-test circuit 4, 21 is activated in accordance with the test start command of the tester device 11. The role of the first memory module 2 can thus be performed by any of the memory modules 2, 3 thus produced if it has already been tested for defects and—with or without a repair step—functions entirely satisfactorily.

In accordance with the method according to the invention, the memory modules 2, 3 can reciprocally test one another without having to use valuable resources in the tester device 11. The tester device 11 essentially serves to start the self-test operations and subsequently, i.e. after the conclusion of the self-test operation, to receive the defect data which have been determined therefrom. The received defect data are then processed there in such a way that a repair solution is determined for the repair of defective memory areas in the second memory components 3. The tester device 11 may also serve, in the case of a programmable self-test unit, to transfer setting values to the first self-test unit 21 of the second memory module 3 to be tested.

The test system according to the invention affords the advantage that the test speed with which one of the memory modules 3 is tested may be lower than in a conventional test without reducing the throughput during testing. By virtue of the fact that not every one of the second memory modules 3 is connected to the tester device 11 for the transfer of defect data, the number of connected second memory modules 3 to be tested simultaneously is considerably increased.

Very fast memories are usually used in tester devices 11 in order to store the defect data. This is necessary since, upon the reception of defect data, firstly the previously received defect data of the same memory areas of the same memory module have to be read out, subsequently ORed with the received defect data and then written back to the defect data memory. This essentially has to be effected in real time in order that the defect data from the memory modules to be tested can be used without delay.

In the case of the memory modules 2 according to the invention, it may now be provided that the speed of transmitting the defect data to the first memory module 2 is adapted to the time duration in which the memory modules according to the invention can receive the defect data and can store them in the memory unit 5 in a suitable manner. This may be effected in the conventional manner by ORing the defect data with the defect data already received or else more rapidly by selectively storing only those defect data which indicate a defect. By virtue of the high parallelism during testing with such a test arrangement, which is usually a multiple higher than in customary test arrangements, the speed of transferring the defect data between the first and second memory modules 2, 3 is essentially not restrictive for the throughput. The more slowly the defect data are transferred to the first memory module 2, the smaller the parallelism of the defect data lines 10 would be chosen to be in order to transfer the defect data to the tester device 11 when the self-test operation of one of the test arrangements is concluded. The smaller the parallelism of the defect data line 10, the more test arrangements having first and second memory modules 2, 3 can be simultaneously connected to the tester device 11 and be simultaneously tested. Consequently, the speed of defect data transfer between the first and second memory modules 2, 3 is not significant for the throughput of the entire test system.

It may be expedient, particularly in the case of a test system 1 having a plurality of first memory modules 2 and second memory modules 3 respectively connected thereto, to make available different clock signals for the testing and storage of the defect data and for the read-out of the defect data into the tester device 11. Whereas in a tester device 11 data can only be transmitted or received with a limited tester clock frequency, the test operation which only proceeds between the first and the second memory modules can be carried out more rapidly with a higher clock frequency, which is provided either by an external clock generator (not shown) or by the tester device 11 itself. Primarily if the defect data are stored in the first memory unit 5 in accordance with the above-described selective method for storing defect data, the clock frequency for testing the second memory modules may essentially be chosen to have a high value corresponding to the later operating frequency of the respective second memory module 3. In this case, the terms—dependent on the clock frequencies—for testing and read-out of the defect data for each of the test arrangements connected to the tester device 11 should be coordinated with one another with the aid of a suitable choice of the parallelism of the respective defect data lines in such a way that the idle times of the tester device, i.e., times during which no defect data determined are received from first memory modules 2, can be kept as short as possible.

What is claimed is:

1. An integrated memory module, comprising:
   a memory unit of the integrated memory module;
   a self-test circuit of the integrated memory module and configured to make available test data and test addresses for testing memory areas in the memory unit and to generate defect data depending on the detection of a defect; and
   a test circuit of the integrated memory module and configured to:
   receive defect data from at least one other memory module being tested, and
   store the received defect data in the memory unit according to addresses assigned to the received defect data.

2. The integrated memory module of claim 1, wherein the test circuit is configured to:
  receive defect data from a plurality of other memory modules being tested, and
  store the received defect data of each of the memory modules in a corresponding memory area of the memory unit, each corresponding memory area being assigned to the respective memory module.

3. The integrated memory module of claim 1, further comprising an address assignment unit configured to generate addresses for storing the defect data.

4. The integrated memory module of claim 1, wherein the self-test circuit is configured to generate addresses for storing the defect data.

5. The integrated memory module of claim 1, further comprising a data compression unit configured to compress the received defect data in a redundancy-conforming manner prior to storage in the memory unit.

6. The integrated memory module of claim 1, wherein the test circuit is further configured to receive defect data compressed in a redundancy-conforming manner and to store them according to the assigned addresses.

7. The integrated memory module of claim 6, further comprising an address assignment unit configured to generate memory addresses for storing the compressed defect data, the memory addresses being assigned to memory areas in the other memory module being tested such that each of the compressed defect data can be assigned to a corresponding memory area in the memory unit.

8. The integrated memory module of claim 7, wherein the address assignment unit is configured to generate the memory addresses from the test addresses generated by the self-test circuit.

9. The integrated memory module of claim 7, wherein the address assignment unit comprises a shift register configured to divide an address value of the test address in accordance with a compression factor of the defect data compressed in the redundancy-conforming manner.

10. The integrated memory module of claim 1, further comprising a read-out unit configured to read out the defect data stored in the memory unit.

11. The integrated memory module of claim 1, further comprising a command decoding unit configured to operate the integrated memory module in a test mode, in which the self-test circuit tests the memory unit and outputs defect data dependent on a detected defect.

12. The integrated memory module of claim 1, further comprising a command decoding unit configured to operate the integrated memory module in a test mode, in which the test circuit receives the defect data and stores the received defect data in respectively assigned memory areas of the memory unit.

13. The integrated memory module of claim 1, further comprising a command decoding unit configured to:
  operate the integrated memory module in a first test mode, in which the self-test circuit tests the memory unit and outputs defect data dependent on a detected defect; and
  operate the integrated memory module in a second test mode, in which the test circuit receives the defect data from the other memory module and stores the received defect data in respectively assigned memory areas of the memory unit.

14. A test system, comprising:
  a first memory module being tested, wherein outputs of the first memory module are connected to defect data lines;
  a second memory module, comprising:
    a memory unit;
    a self-test circuit configured to make available test data and test addresses for testing memory areas in the memory unit and to generate defect data depending on the detection of a defect; and
    a test circuit configured to:
      receive defect data from the first memory module being tested, via the defect data lines, and
      store the received defect data in the memory unit according to addresses assigned to the received defect data; and
  an external defect data evaluation unit configured to read out the stored defect data from the memory unit after the end of a test operation.

15. The test system of claim 14, wherein a external defect data evaluation unit is configured to start a test operation in the first memory module and the storage of the defect data in the second memory module by issue of a test start command.

16. The test system of claim 14, further comprising a plurality of the first memory module each connected to a respective one of a plurality of the second memory module; wherein, in a plurality of test steps, each of the plurality of the first memory modules is tested successively with its respectively connected one of the first memory modules, and wherein, during the testing of each of the plurality of the first memory modules, defect data of a preceding test step is read out to the defect data evaluation unit.

17. A method for testing one or a plurality of memory modules with a testing memory module, comprising:
  receiving a test start command by the plurality of memory modules signaling initiation of a self-test operation;
  determining defect data in the plurality of memory modules depending on a detected defect;
  transferring the defect data from the plurality of memory modules to the testing memory module;
  storing the defect data in the testing memory module, the defect data being stored in addresses corresponding to memory areas from which the defect data was read in a respective one of the plurality of memory modules; and
  transmitting the defect data after termination of the self-test operation and storage of all the defect data.

18. The method of claim 17, further comprising evaluation of the defect data in order to determine a repair solution.

19. The method of claim 17, further comprising compressing the defect data prior to transferring.

20. The method of claim 17, further comprising compressing the defect data in a redundancy-conforming manner prior to transferring.

21. The method of claim 17, further comprising compressing the defect data in a redundancy-conforming manner in the first memory module.

* * * * *